United States Patent [19]

Yajima et al.

[11] Patent Number: 5,153,434

[45] Date of Patent: Oct. 6, 1992

[54] ELECTRON MICROSCOPE AND METHOD FOR OBSERVING MICROSCOPIC IMAGE

[75] Inventors: Yusuke Yajima, Kokubunji; Masakazu Ichikawa, Tokyo; Mikio Ichihashi, Kodaira; Ryo Suzuki; Masatoshi Takeshita, both of Hachiohji, all of Japan

[73] Assignee: Hitachi, Ltd., Tokyo, Japan

[21] Appl. No.: 701,090

[22] Filed: May 16, 1991

[30] Foreign Application Priority Data

May 18, 1990 [JP] Japan .................. 2-126785

[51] Int. Cl.⁵ .................. H01J 37/28
[52] U.S. Cl. .................. 250/311; 250/442.1
[58] Field of Search .................. 250/311, 440.1, 442.1, 250/397, 398

[56] References Cited

U.S. PATENT DOCUMENTS

| | | | |
|---|---|---|---|
| 3,745,341 | 7/1973 | Sakitani | 250/442.1 |
| 3,887,811 | 6/1975 | Livesay | 250/442.1 |
| 3,908,124 | 9/1975 | Rose | 250/311 |
| 3,909,611 | 9/1975 | von Rauch | 250/440.1 |
| 4,382,182 | 5/1983 | Matsuzaka et al. | 250/311 |
| 4,506,154 | 3/1985 | Scire | 250/442.1 |
| 4,618,766 | 10/1986 | van der Mast et al. | 250/311 |
| 4,691,103 | 9/1987 | Le Poole et al. | 250/311 |
| 5,004,918 | 4/1991 | Tsuno et al. | 250/311 |
| 5,012,092 | 4/1991 | Kobayashi et al. | 250/311 |
| 5,055,679 | 10/1991 | Ninomiya et al. | 250/307 |

OTHER PUBLICATIONS

Physical Review, B25, 1982, 6799-6804.

Ultramicroscopy 3, 1978, pp. 203-214.

Primary Examiner—Jack I. Berman
Assistant Examiner—Kiet T. Nguyen
Attorney, Agent, or Firm—Fay, Sharpe, Beall, Fagan, Minnich & McKee

[57] ABSTRACT

An electron microscope and a method for obtaining microscopic images whereby the intensity and distribution of the internal magnetic field of a specimen are acquired with precision. The electron microscope irradiates a focused electron beam at a target specimen and detects the transmitted beam past the specimen. The irradiated position on the specimen is selected by one of three ways: by moving the specimen alone, by deflecting the focused electron beam before it enters the specimen, or by combining these two ways. In this setup, the internal magnetic field of the specimen under its irradiated spot is known through detection of the deflection of the electron beam caused by the Lorentz force and through arithmetic processing of the detected deflection. An actuator that moves the specimen comprises a support with a hole through which the electron beam passes, a specimen stage with a like hole, a plurality of piezoelectric devices, and a structure that lets the electron beam pass therethrough. The actuator also comprises a mobile stage mounted on the support and attached to the specimen stage via the multiple piezoelectric devices, the mobile stage causing the devices to shift the support normal to the electron beam. Another component of the actuator is a stage control means for supplying a driving voltage to the multiple piezoelectric devices for their position control.

42 Claims, 11 Drawing Sheets

FIG. 17A  LARGE AREA STANDARD MEASUREMENT
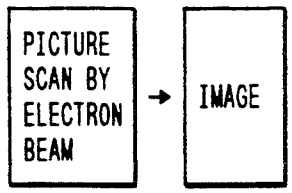
FIG. 17B  SMALL AREA STANDARD MEASUREMENT
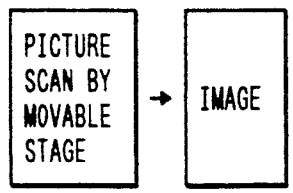
FIG. 17C  LARGE AREA HIGH RESOLUTION MEASUREMENT (I)
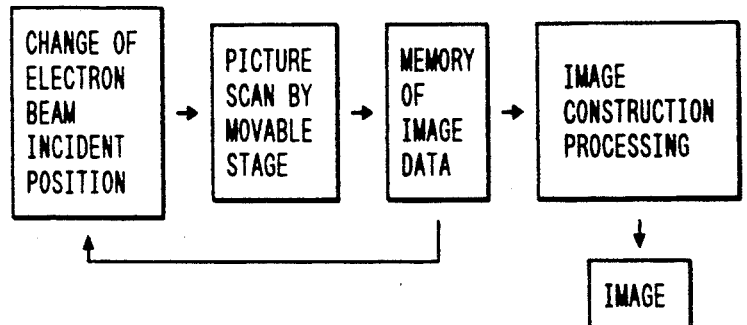
FIG. 17D  LARGE AREA HIGH RESOLUTION MEASUREMENT (II)
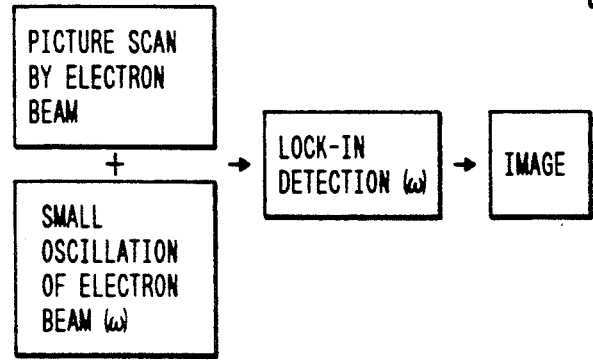
FIG. 17E  SMALL AREA HIGH RESOLUTION MEASUREMENT
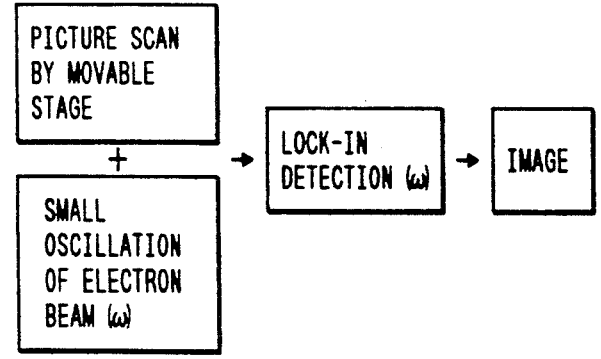

ELECTRON MICROSCOPE AND METHOD FOR OBSERVING MICROSCOPIC IMAGE

BACKGROUND OF THE INVENTION

1. Field of the Invention

The present invention relates to an electron microscope and a method for observing microscopic images obtained thereby. More particularly, the invention relates to an electron microscope suitable for obtaining a distribution image of the intensity and direction of a magnetic field inside a specimen, and to a method for observing microscopic images obtained by that microscope.

2. Description of the Related Art

Conventionally, the so-called defocus Lorentz method is used to measure the internal magnetic field of a specimen composed of a ferromagnetic or antiferromagnetic material. The method is implemented through the use of a transmission electron microscope. In operation, the electron beam generated by the electron microscope is focused a little below or above the specimen so that the deflection of the electron beam within the specimen is obtained as a black-and-white contrast image. This method is illustratively described in a Japanese publication titled "Thin Films" by Kanehara and Fujiwara (Shokabo, 1979).

The electron holography method, as described in Physical Review, B25 (1982), 6799 and on, has recently become popular for similar observation purposes. This method involves observing electron waves transmitted through a magnetic specimen with respect to the interference with a reference electron wave.

Another method for observing the internal magnetic field of a magnetic material is about to be put to practical use. Depicted in Ultramicroscopy, 3 (1978), p. 203, this method is based on the so-called DPC-STEM (Differential Phase Contrast Scanning Transmission Electron Microscope). In operation, the electron microscope detects a deflection of a focused electron beam, the deflection being caused by the Lorentz force to which the beam is subjected when the latter passes through a specimen.

Of the above prior art methods, the defocus Lorentz method has the following disadvantages: One disadvantage is that because the focal point of the transmitted electron beam is shifted away from a specimen, the defocus Lorentz method fails to provide a distribution image of a magnetic field within the specimen at a sufficiently high level of resolution. Another disadvantage is that with the electron beam irradiated over the entire surface of the specimen, the micro-analysis of a specific spot on the specimen is not available.

The electron holography method is superior to the defocus Lorentz method in terms of resolution, but the former method still irradiates its electron beam over the entire surface of a specimen, making the micro-analysis of specimen spots impossible. On the other hand, the DPC-STEM method allows a focused electron beam to be directed at a particular target spot on a specimen, thus concurrently permitting micro-analysis of specimen parts. If the electron beam is sufficiently focused under the DPC-STEM method, a high level of resolution is obtained.

However, the DPC-STEM method is dogged by the problem of the so-called spot shift. That is, the incidence spot of the transmitted electron beam shifts in a detecting apparatus as the beam is made to scan a specimen. Meanwhile, the incidence spot shifts due to the Lorentz force stemming from the magnetic field inside the specimen. When the incidence spot shift becomes as large as the scan-caused spot shift, it is impossible to detect the magnetic field inside the specimen.

SUMMARY OF THE INVENTION

It is therefore an object of the present invention to provide an electron microscope and a method for observing microscopic images obtained thereby, the microscope and the method acquiring a distribution image of a magnetic field within a specimen at a high level of spatial resolution, the microscope and the method further permitting micro-analysis of the specimen without being disturbed by a spot shift of the electron beam that scans the specimen.

In carrying out the invention and according to one aspect thereof, there is provided an electron microscope and a method for observing microscopic images obtained thereby. The microscope and the method have a focused electron beam directed at a target specimen for detecting an electron beam transmitted through the specimen, and are used in connection with a method for moving the specimen alone in order to select that spot on the specimen at which the focused electron beam is directed. The microscope or the method may alternatively be used in connection with both a method for deflecting the focused electron beam before the incidence thereof into the specimen and a method for moving the specimen or scanning the focused electron beam over the specimen, the microscope or the method obtaining the status of the internal magnetic field of the specimen through detection of the deflection of the electron beam caused by the Lorentz force and through execution of numerical processing of the data resulting from that detection.

Specifically, the electron microscope has a specimen actuator which moves a specimen or causes an electron beam to scan the specimen with ease and precision, the specimen actuator comprising a plurality of piezoelectric devices, a mobile stage and a stage control means, the mobile stage having a hole to which the target specimen is fixed and through which the electron beam passes through. The piezoelectric devices cause the mobile stage to move the specimen perpendicularly to the electron beam, and the stage control means supply the piezoelectric devices with a driving voltage for beam spot control.

A detector for detecting the electron beam deflection caused by the Lorentz force is preferably embodied using a split type detector and an arithmetic processing circuit. The split type detector comprises four parts that are centered on an optical axis and split by boundaries normal to each other; the role of the detector is to detect a signal representing the amount of an electron beam transmitted through a specimen. The arithmetic processing circuit performs arithmetic processing given the output from the split type detector.

When suitably embodied, the invention provides microscopic images not only by having an electron beam scan a specimen, like conventional electron microscopes, but also by moving the specimen instead of the beam. While the specimen is being moved so as to get an image, the focused electron beam is allowed to remain fixed. That is, except for the internal magnetic field of the specimen, the factors that cause the electron beam transmitted through the specimen to deflect remain constant regardless of the spot at which the specimen is irradiated. For this reason, the image quality does not deteriorate in the corners; the image as a whole is an accurate magnetic field distribution image of the specimen. At the same time, it is possible to obtain spatial resolution as high as that of the DPC-STEM method.

Image acquisition through specimen movement involves scanning by piezoelectric devices. The scheme has conventionally posed this problem: that the high resolution with which images are obtained comes with a limited range of measurement. However, this problem is resolved by one embodiment of the invention. Specifically, the electron beam is made to scan the specimen even as the latter is being moved for microscopic image acquisition.

BRIEF DESCRIPTION OF THE DRAWINGS

FIG. 17(a-e) are a set of block diagrams depicting methods for observing microscopic images according to the invention.

DESCRIPTION OF PREFERRED EMBODIMENTS

Preferred embodiments of the present invention will now be described with reference to the accompanying drawings.

Figure 1:
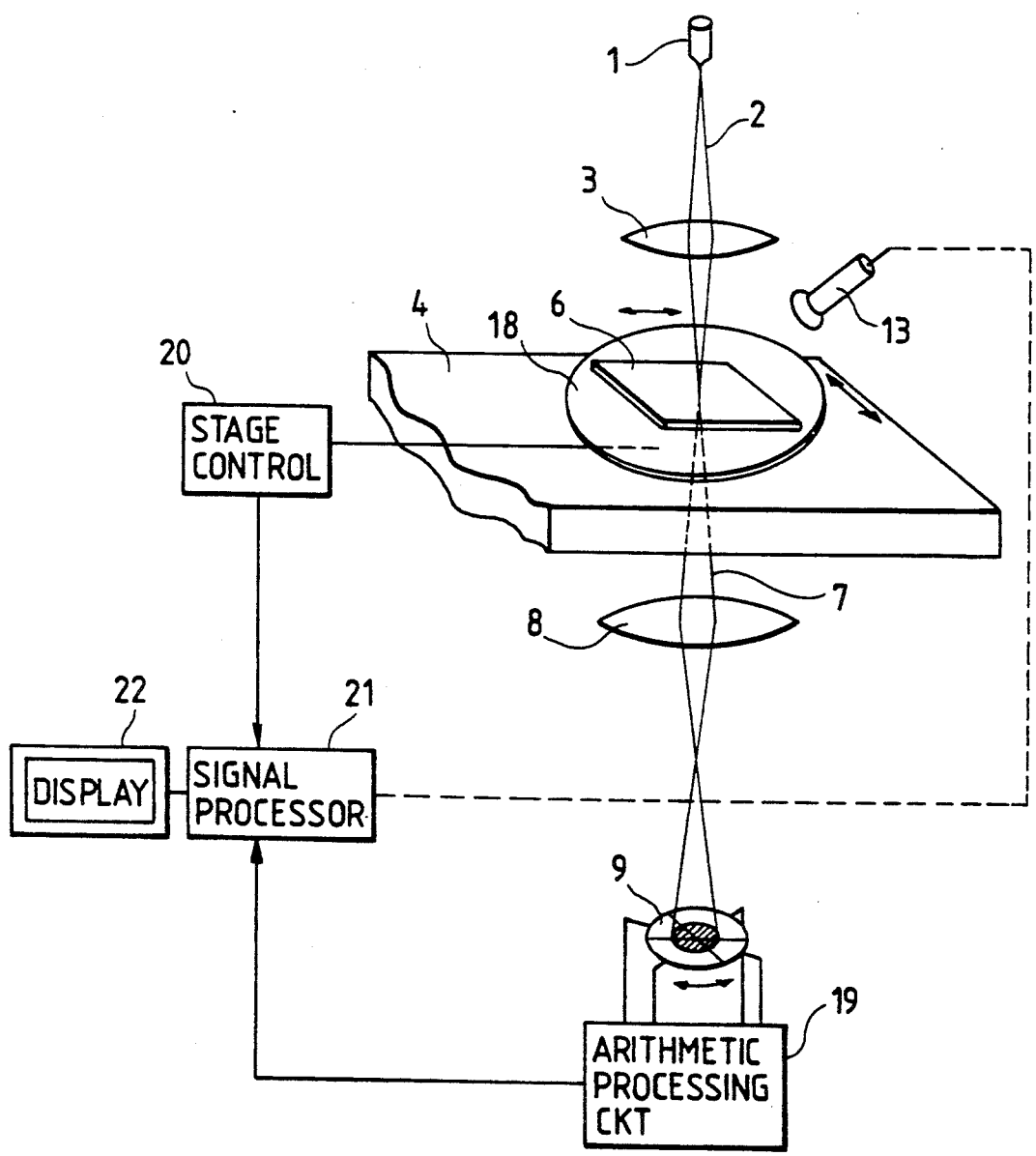
FIG. 1 is a block diagram showing major components of an electron microscope practiced as a first embodiment of the present invention.

FIG. 1 is a block diagram of the electron microscope practiced as the first embodiment of the invention. In FIG. 1, electron beam 2 generated by an electron gun 1 is focused by an incident electron optics 3. The focused electron beam is irradiated at a particular spot (called an irradiated spot) of a specimen 6 fixedly secured to a support 18 of the specimen stage 4. These components make up a mechanism for directing the focused electron beam to the specimen 6 to be observed. As will be described later in more detail with reference to FIG. 2, the support 18 is attached to a mobile stage mounted on the specimen stage 4. Under control by the signal from a stage controller 20, the support 18 is made to move or scan at a right angle to the electron beam 2.

A transmitted electron beam 7 past the specimen 6 is focused by transmitted electron optics 8 before being input to a detector 9 which comprises a rotatable planar electrode or a planar fluorescent screen. The signal leaving the detector 9 carries information on the magnetic field of the irradiated spot within the specimen 6. As the mobile stage is moved on the specimen stage 4 so as to make the electron beam 2 scan the specimen 6 with its irradiated spot, the signal from the detector 9 is sent to an arithmetic processing circuit 19. The arithmetic processing circuit 19 carries out arithmetic operations to be described later with reference to FIGS. 5 and 6. The circuit 19 outputs an information signal concerning the intensity and direction of the magnetic field within the specimen.

The stage controller 20 outputs information on the position of the electron beam 2 on the specimen 6, and the arithmetic processing circuit 19 outputs its signal synchronously. The information and the signal are applied to a signal processor 21 which is typically a microprocessor. The signal processor 21 converts the received signals into an image signal that is displayed in image format on a display 22. The display 22 has an image processing capability to make the image more distinct visually.

A secondary electron detector 13 detects secondary electrons emanating from the specimen 6. This detector is not indispensable since the secondary electrons it detects only supplement the analysis of the specimen 6. As with the output of the detector 9, the output of the secondary electron detector 13 is fed to the signal processor 21 in synchronization with the information on the position of the irradiating beam onto the specimen 6. This provides data regarding the shape of the specimen 6. The secondary electron detector 13 may be replaced with an X-ray detector that affords X-ray images. This alternative provides information on the distribution of elements in the specimen.

How the first embodiment works will now be described. In FIG. 1, the electron beam 2 enters the irradiated spot of the specimen 6 as focused. After the electron beam 2 is absorbed and scattered in a way depending on the composition and shape of the irradiated spot, the beam leaves the specimen 6. Because of the absorption and scattering, the transmitted electron beam 7 past the specimen 6 is lower in intensity than the electron beam 2 entering the specimen.

As the total intensity of the transmitted electron beam 7 past the specimen is being monitored by the detector 9, the support 18 is moved so as to shift the irradiated spot of the electron beam 2 over the specimen 6. This provides acquisition of a microscopic image reflecting the composition and shape of the specimen 6.

FIGS. 2 through 5 are perspective views showing embodiments of the specimen stage 4 and support 18 on the electron microscope that is practiced as the first embodiment of the invention.

Figure 2:
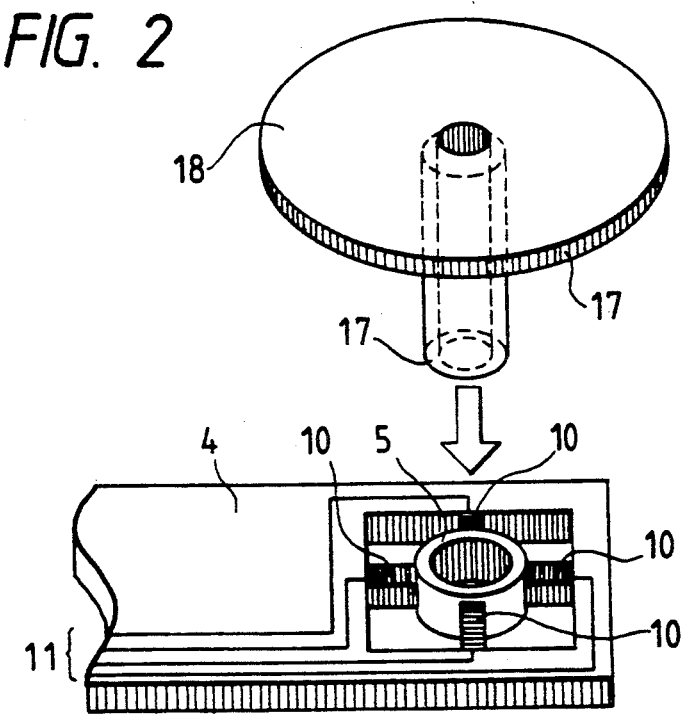
FIGS. 2 through 5 are perspective views depicting embodiments of a specimen stage section for use with the first embodiment of FIG. 1.

In FIG. 2, the mobile stage 5, constructed to let the electron beam 2 pass therethrough, is secured to the specimen stage 4 via four piezoelectric devices 10. The piezoelectric devices 10 have wiring for supplying voltages which in turn generate an electric field inducing a piezoelectric effect. Specifically, the wiring 10 supplies voltages of up to hundreds of volts at an accuracy level of several mV. This causes the mobile stage 5 to move within a range of several μm at an accuracy level of several pm. The specimen 6 is fixedly attached to the support 18 equipped with a shield 17, the support being in turn mounted on the mobile stage 5. The role of the shield 17 is twofold: to prevent the electric field given to the piezoelectric devices 10 from affecting the incident electron beam 2 and the transmitted electron beam 7; and to keep the electron beam 2, and the scattered or secondary electrons thereof, from irradiating the piezoelectric devices 10. The specimen stage 4 is attached to the microscope body via a manually operated coarse positioning mechanism (not shown in FIG. 2) which moves the specimen stage 4 in a range of several μm to several cm. The specimen stage 4 is highly resistant to temperature drift, has high rigidity, and is not much hampered by mutual interference between axes.

Figure 3:
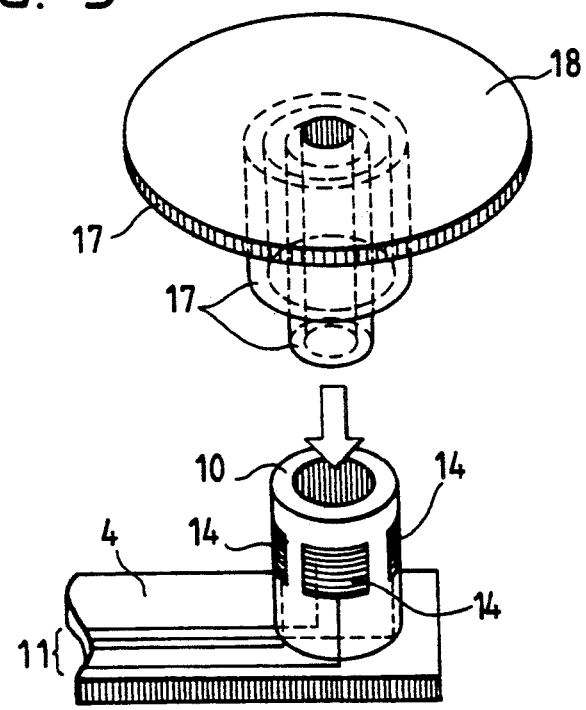

In the embodiment of FIG. 3, the speciment stage 4 has the piezoelectric device 10 mounted on a cylindrical base. On the side of the piezoelectric device 10 are two opposed pairs of electrodes 14. When the opposed electrodes are supplied with a potential to expand or contract the piezoelectric device 10 along the cylinder axis, the specimen 6 is moved on two axes at a sufficiently high level of accuracy. The specimen stage 4 is small and highly rigid. As with the embodiment of FIG. 2, the specimen 6 is fixedly mounted on the support 18 equipped with the shield 17.

Figure 4:
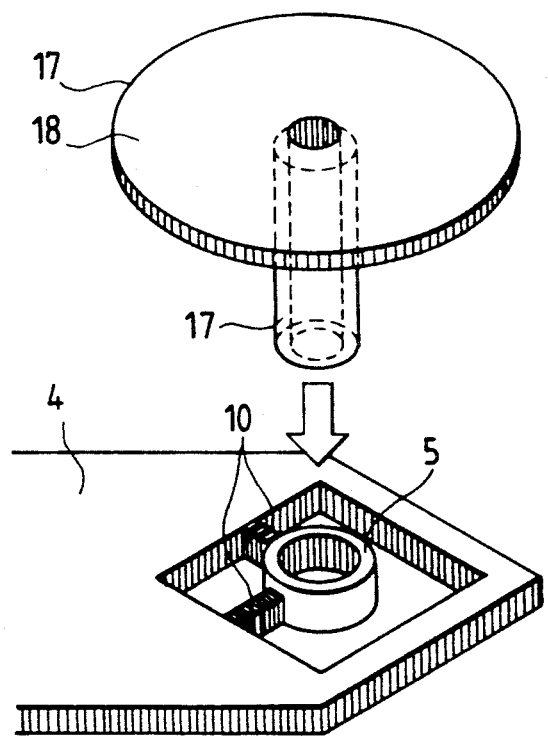

In the embodiment of FIG. 4, the specimen stage 4 has the mobile stage 5 supported by two piezoelectric devices 10. This specimen stage is easy to manufacture and has very small mutual interference between axes. As with the embodiments of FIGS. 2 and 4, the speciment stage 6 is fixedly attached to the support 18 equipped with the shield 17.

Figure 5:
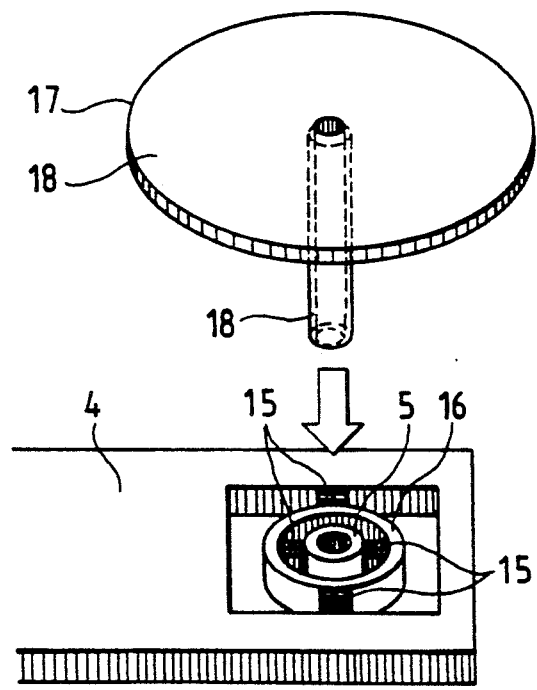

In the embodiment of FIG. 5, the speciment stage 4 has the mobile stage 5 supported by two pairs of composite piezoelectric devices 15 through an intermediate stage 16. The composite piezoelectric devices 15, composed of different piezoelectric materials or of a plurality of electrodes for generating different electric fields, bulge when supplied with a potential. This specimen stage 4 has no interference between axes and allows the specimen 6 to move over a relatively large area. As with the embodiments of FIGS. 2, 3 and 4, this specimen stage 4 is fixedly attached to the support 15 having the shield 17.

Figure 6:
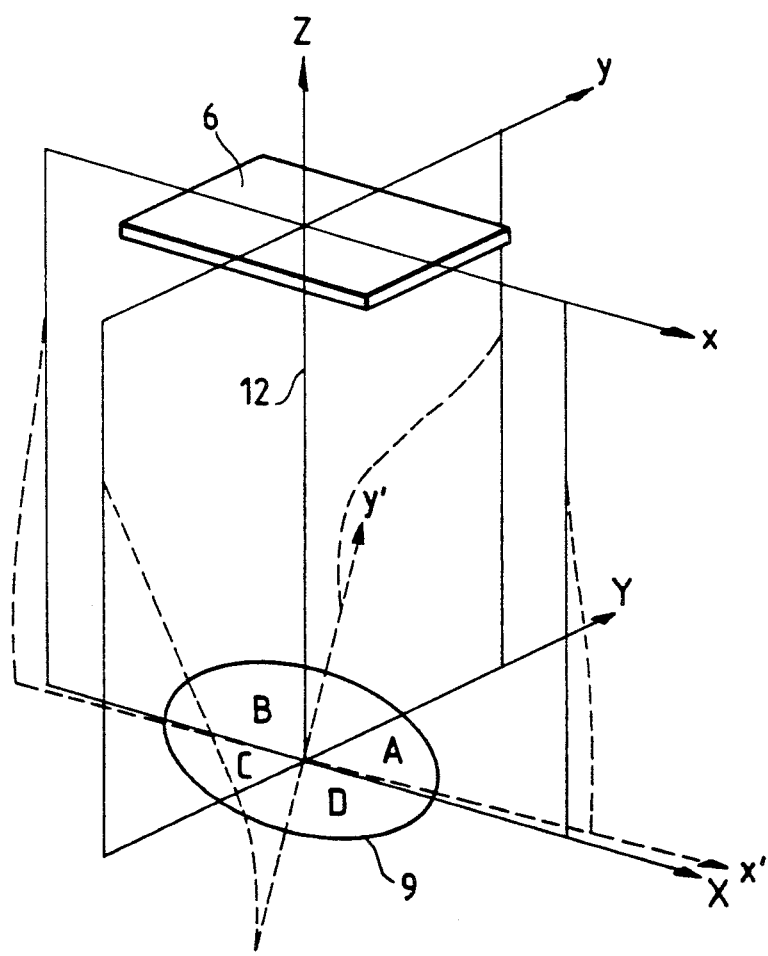
FIGS. 6 through 9 are views describing how a detector 9 measures the internal magnetic field of a specimen 6 in FIG. 1.

Referring to FIG. 6, what follows is a description of how the detector 9 in the embodiment of FIG. 1 is constructed and how it works. In FIG. 6, the detector 9 has a planar structure split into four parts by sufficiently narrow boundaries normal to each other. The detector 9 is set up so that its plane is normal to the optical axis 12 of the electron optics. There may be assumed a case in which the above-mentioned boundaries constitute an X and a Y axis so as to form a right-hand side section, with a Z axis set in the direction of the specimen 6 as viewed from the detector 9. In that case, the optical axis 12 is adjusted to pass through the point of intersection formed by the X and Y axes, i.e., the origin.

Those four parts of the detector 9 which are separated by the X and Y axes correspond to the conventionally defined first, second, third and fourth quadrants of a plane coordinate system. The four quadrants may be called A, B, C and D, respectively. If the transmitted electron beam 7 past the specimen 6 is not deflected relative to the optical axis 12, the signal intensities detected in the parts A, B, C and D are the same; if the transmitted electron beam 7 is deflected relative to the optical axis 12, the signal intensities in the parts A through D differ from one another.

In the current setup, the effective area of the detecting surface on the detector 9 is sufficiently large. This makes it possible to receive the transmitted electron beam 7 always in some part of the detecting surface on the detector 9 even if the beam is deflected. Thus analysis of the signal intensities in the parts A through D, to be described later, allows the center position of the transmitted electron beam 7 to be known within the X-Y coordinate system.

The detector 9 may also be a combination of a fluorescent screen or scintillator and an image acquiring device. The fluorescent screen or scintillator converts the distribution of the incident electron beam 7 into an optical image; the image acquiring device such as a CCD has a large number of pixels for converting the optical image into an electric signal.

The principal factor that deflects the transmitted electron beam 7 relative to the optical axis 12 is the internal magnetic field of the specimen 6 under its irradiated spot. As the electron beam 7 passes through the specimen 6, the internal magnetic field of the latter generates a Lorentz force which deflects the beam 7. The direction and the magnitude of the deflection of the transmitted electron beam 7 depend on the direction and the intensity of the internal magnetic field inside the specimen 6 under the spot at which the electron beam is irradiated.

As described, the X and Y coordinates of the center of the transmitted electron beam 7 through the detector 9 reflect the direction and the intensity of the magnetic field within the specimen 6 under the spot at which the electron beam is irradiated.

In practice, the amount of deflection of the electron beam 7 past the specimen 6 is magnified by the transmitted electron optics 8 of FIG. 1 for detection with sufficient sensitivity. At the same time, as it passes through the transmitted electron optics 8, the deflected electron beam 7 rotates relative to the optical axis 12. Referring to FIG. 6, it is assumed that coordinate axes (x and y) having the same directions as those of the X and Y axes defined on the detector 9 are defined on the specimen 6. In that case, the direction of the electron beam 7 deflected by the internal magnetic field of the specimen 6 coincides with that of the center of the beam 7 as it reaches the detector 9, the coordinate axes x' and y' of the beam center being rotated at a certain degree relative to the X and Y axes.

Figure 7:
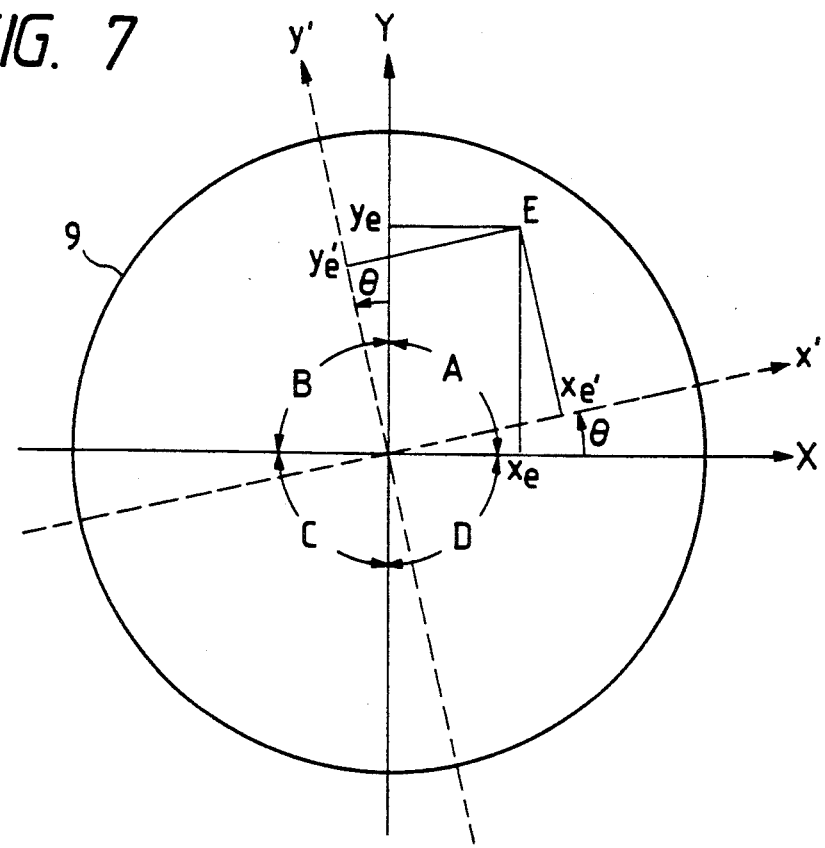

As shown in FIG. 7, if the x' and y' axes defined on the detector 9 are rotated at an angle of $\theta$ relative to the X and Y axes also defined on the detector 9, the relations $$x_e' = x_e \cos\theta + y_e \sin\theta \qquad (1)$$

$$y_e' = -x_e \sin\theta + y_e \cos\theta$$

exist between the components $(x_e, y_e)$ of point E in the X-Y coordinate system and the components $(x_e', y_e')$ thereof in the x'-y' coordinate system. If the center of the electron beam 7 deflected within the specimen 6 of FIG. 6 enters point E on the detector 9 of FIG. 7, the direction of point E on the x' and y' axes matches the direction of the electron beam 7 as it is deflected by the internal magnetic field of the specimen 6, the deflection taking place on the x and y axes defined on the specimen 6.

Figure 8:
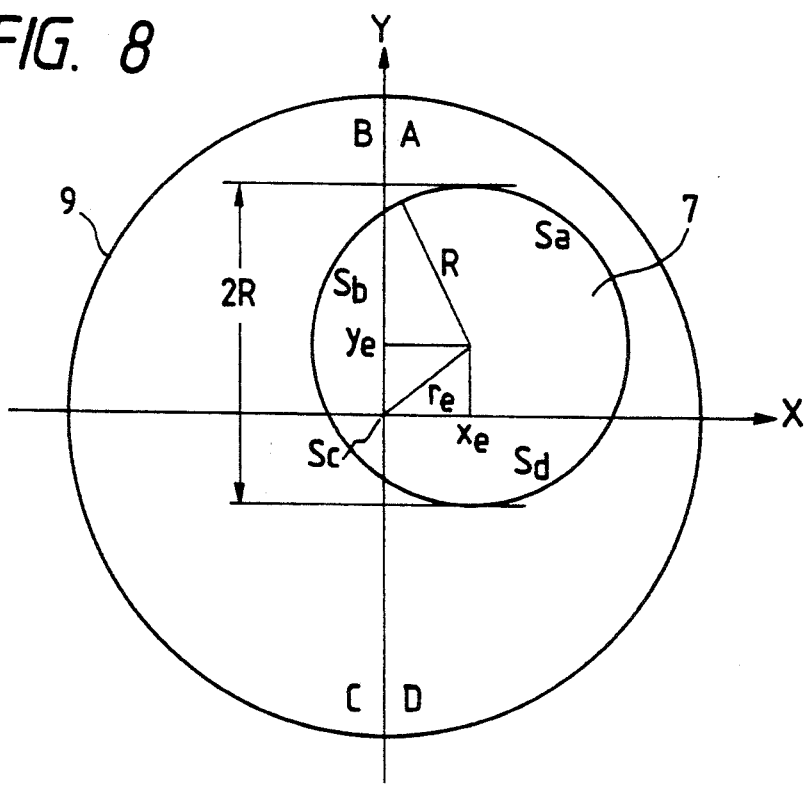

Referring to FIG. 8, there will now be described how to find the center position $(x_e, y_e)$ of the electron beam 7 entering the detector 9 having the split electrode plates A through D. Specifically, the center position of the incident beam is found through analysis of the signal intensities of the beam 7 at the electrode plates A through D, the intensities being respectively called Ia, Ib, Ic and Id. In this embodiment, the cross section of the electron beam 7 entering the detector 9 is a circle with a radius of R. At any point within the circle, the current density of the electron beam 7 is the same with sufficient accuracy.

If the sectional areas of the electron beam 7 that enters the parts A through D of the detector 9 are called Sa, Sb, Sc and Sd, the relations $$Sa + Sb + Sc + Sd = \pi R^2 \quad (2)$$

$$Sa/Ia = Sb/Ib = Sc/Ic = Sd/Id = \pi R^2/It \quad (3)$$

exist with sufficient accuracy. In the above equations, It stands for the total signal intensity of the electron beam 7.

Then, xapp and yapp are defined as $$xapp = \frac{\pi R}{4} \cdot \frac{Sa - Sb - Sc + Sd}{\pi R^2} \quad (4)$$

$$= \frac{R}{4}\left(\pi - 2\cos^{-1}\frac{x_c}{R}\right) + \frac{x_c}{2}\sqrt{1 - \left(\frac{x_c}{R}\right)^2}$$

$$yapp = \frac{\pi R}{4} \cdot \frac{Sa + Sb - Sc - Sd}{\pi R^2}$$

$$= \frac{R}{4}\left(\pi - 2\cos^{-1}\frac{y_c}{R}\right) + \frac{y_c}{2}\sqrt{1 - \left(\frac{y_c}{R}\right)^2}$$

If $x_e$ and $y_e$ are sufficiently smaller than the radius R, the values xapp and yapp match $x_e$ and $y_e$, respectively, as derived from the equations (4) above.

From the equations (3) and (4), the values xapp and yapp are also expressed using Ia, Ib, Ic, Id and It as $$xapp = \frac{\pi R}{4} \cdot \frac{Ia - Ib - Ic + Id}{It} \quad (5)$$

$$yapp = \frac{\pi R}{4} \cdot \frac{Ia + Ib - Ic - Id}{It}$$

Figure 9:
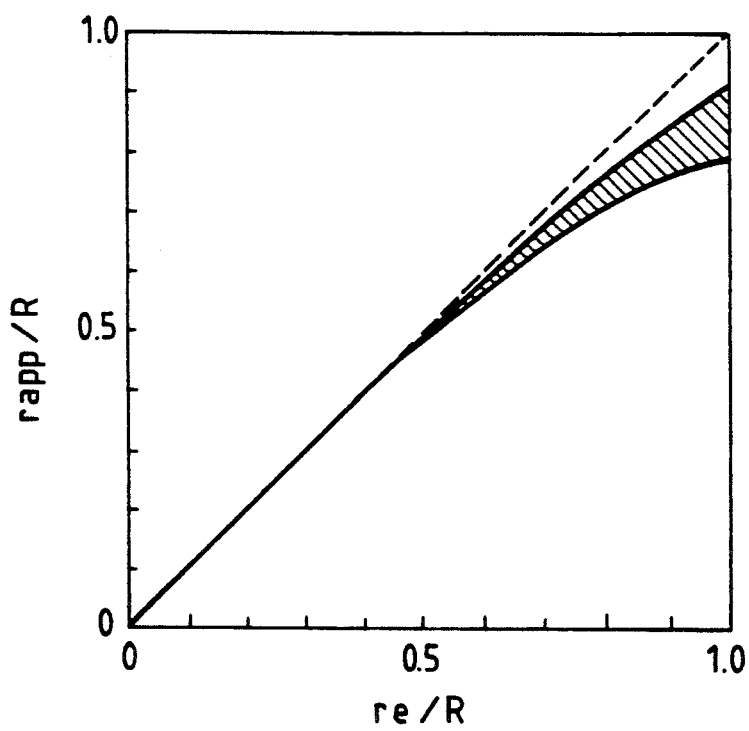

FIG. 9 illustrates the relationship between $$rapp = \sqrt{xapp^2 + yapp^2} \quad (6)$$

and $$r_e = \sqrt{x_e^2 + y_e^2} \quad (7)$$

in order to show the magnitude of the error stemming from using the values xapp and yapp as approximate values of $x_e$ and $y_e$, respectively. In FIG. 9, the shaded area represents the range that may be taken by the value rapp at each $r_e$. Needless to say, FIG. 9 depicts how precisely the distance from the origin is reproduced when the equations (5) above are utilized.

As shown in FIG. 9, if the value $r_e$ is equal to or less than half of the radius R, the error from replacing $R_e$ with rapp is 5% or less. If the value $r_e$ is close to the radius R, the values xapp and yapp defined by the equations (5) are each multiplied by a coefficient C ($1 < C < 4/\pi \approx 1.27$) for use respectively as the approximate values of $x_e$ and $y_e$. This makes the overall error smaller than that which would occur if the equations (5) were used unchanged. After this correction, however, the accuracy in effect when the value $r_e$ is sufficiently smaller than the beam radius R is obviously worse than that applicable where the equations (5) are used.

The above-described method fails to designate the point ($x_e$, $y_e$) if any two of Ia, Ib, Ic and Id become zero. For example, if Ib = Ic = 0, all that can be known is that $x_e \leq R$; the value cannot even be approximated. That situation may be avoided by making the beam radius R sufficiently large.

Below is a description of the relationship between the internal magnetic field of the specimen 6 under its electron beam-irradiated spot and the values $x_e$ and $y_e$.

First, it is assumed that the electron beam 7 is not enlarged in diameter by deflection in the transmitted electron optics 8. In that case, the relationship between the intensity $B_0$ of the internal magnetic field and the distance $D_0$ from the origin of the X-Y coordinate system (in which the center of the incident beam 7 to the detector 9 is shown in FIG. 8) is given as $$D_0 = r\left(1 - \sqrt{1 - \left(\frac{t}{r}\right)^2}\right) + L\frac{t}{r}\frac{1}{\sqrt{1 - \left(\frac{t}{r}\right)^2}} \quad (8)$$

$$r = \frac{c}{eB_0}\sqrt{2mE}$$

where, E stands for the energy of the incident electron beam, t for the thickness of the specimen 6, L for the length or distance between the lower surface of the specimen 6 and the detector 9, m for the electron mass, e for the electron charge modulus, and c for the velocity of light. In this embodiment, $B_0 = 10^4$ G, $E = 10^5$ eV to $10^{-7}$ erg, $t = 10^{-6}$ cm, and $L = 10^2$ cm. Thus the equations (8) may be approximated with sufficient accuracy as follows:

$$D_0 = L\left(\frac{t}{r}\right) = \frac{Lte}{c\sqrt{2mE}}B_0 \quad (9)$$

That is, the distance $D_0$ is about $10^{-3}$ cm = 10 μm.

Because the distance $D_0$ is too small to detect with the detector 9, the deflection of the electron beam 7 is magnified by the transmitted electron optics 8. If M represents the magnification and if the center position of the electron beam 7 entering the detector 9 is ($X_0$, $Y_0$) in the X-Y coordinate system, the relationship $$D_0 = \frac{\sqrt{X_0^2 + Y_0^2}}{M} \quad (10)$$

is established. The magnification M is generally 100 x or higher. Therefore, if $$F = \frac{c\sqrt{2mE}}{MLte} \quad (11)$$

then from the equation (9), we get $$B_0 = F\sqrt{X_0^2 + Y_0^2} \quad (12)$$

What follows is a description of how to find the components (Bx, By) of the internal magnetic field of the specimen 6 under its irradiated spot, the components being relative to the x and y axes defined on the specimen 6 in FIG. 6. First to be considered is how to represent the point whose coordinates are ($X_0$, $Y_0$) on the detector 9 using the x' and y' coordinates defied on the detector 9 relative to the x-y coordinate system defined on the specimen 6 (the components are $(X_0', Y_0')$. From the equations (1), we get $$X_0' = X_0 \cos \theta + Y_0 \sin \theta \quad (13)$$

$$Y_0' = -X_0 \sin \theta + Y_0 \cos \theta$$

Since the components $X_0'$ and $Y_0'$ correspond to the deflecting direction of the electron beam 7 viewed from the x and y coordinates on the specimen 6, we get $$Bx = F' Y_0' \quad (14)$$

$$By = -F' X_0'$$

where, $F'$ is a constant. Furthermore, because $$\sqrt{Bx^2 + By^2} = B_0 \quad (15)$$

and with the equations (12), (13) and (14) taken into account, we get $$F = F' \quad (16)$$

To sum up, the signals Ia, Ib, Ic and Id obtained with the four parts A through D of the detector 9 are used to calculate $$X_0 = \frac{\pi R}{4} \cdot \frac{Ia - Ib - Ic + Id}{Ia + Ib + Ic + Id} \quad (17)$$

$$Y_0 = \frac{\pi R}{4} \cdot \frac{Ia + Ib - Ic - Id}{Ia + Ib + Ic + Id}$$

From the equations (13), the components $X_0'$ and $Y_0'$ are obtained. Then using the constant F of equation (11), we get $$Bx = F Y_0' \quad (18)$$

$$By = -F X_0'$$

If the specimen 6 having a known internal magnetic field intensity of Br and a known thickness of tr may be used as the standard sample, the values Xr and Yr of the specimen are calculated as $$Xr = \frac{Ia - Ib - Ic + Id}{Ia + Ib + Ic + Id} \quad (19)$$

$$Yr = \frac{Ia + Ib - Ic - Id}{Ia + Ib + Ic + Id}$$

From this, a coefficient K is obtained as $$Kr = \frac{Br \cdot tr}{\sqrt{Xr + Yr}} \quad (20)$$

With respect to the specimen 6 under observation, the calculations $$Xr_0 = \frac{Ia - Ib - Ic + Id}{Ia + Ib + Ic + Id} \quad (21)$$

$$Yr_0 = \frac{Ia + Ib - Ic - Id}{Ia + Ib + Ic + Id}$$

are made. From this, we get $$Xr_0' = Xr_0 \cos \theta + Yr_0 \sin \theta \quad (22)$$

$$Yr_0' = -Xr_0 \sin \theta + Yr_0 \cos \theta$$

The components of the internal magnetic field are calculated as $$Bx = \frac{Kr}{t} Yr_0' \quad (23)$$

$$By = -\frac{Kr}{t} Xr_0'$$

where, t stands for the thickness of the specimen 6. The value Kr has the relation $$Kr = tF \frac{\pi R}{4} \quad (24)$$

with the value F defined by the equation (11). The values E, M and L which are needed to obtain F, as well as the value R, are not needed in determining the value Kr.

If it is desired to determine the angle $\theta$ for the equations (22), one way to do so is to take the following steps: First, the direction of the internal magnetic field and $By'/Bx'$ are determined for the standard sample. Then with the values Xr and Yr determined using the equations (19), we get $$\theta = \tan^{-1} \frac{\frac{Bx'}{By'} + \frac{Yr}{Xr}}{\frac{Bx}{By} \cdot \frac{Yr'}{Xr'} - 1} \quad (25)$$

With the standard specimen in use, another way to determine the internal magnetic field of the specimen 6 is to use the rotation mechanism of the detector 9 discussed with reference to FIG. 1. The rotation mechanism allows the detector 9 to be rotated by a desired angle around the optical axis 12 taken as the rotation axis at the origin in FIG. 6.

Under this alternative method, the internal magnetic field is determined as follows: First, the direction of the internal magnetic field of the standard sample under its irradiated spot is made to match that of the rotation axis. Conversely, the direction of the internal magnetic field may be defined as the x axis. Then the detector 9 is rotated, and stopped when the equations $$Ia - Ib - Ic + Id = 0$$

$$Ia + Ib - Ic - Id = maximum \quad (26)$$

are established. Under these conditions, the boundaries of the four parts A through D constituting the detector 6 in FIG. 6 coincide with the x' and y' coordinate axes.

With the above preparations carried out, the equations (21) are calculated for the specimen 6 under observation. This makes it possible to bypass the equations (22) when the components Bx and By of the internal magnetic field of the specimen 6 are determined as $$Bx = \frac{Kr}{t} Yr_0 \quad (27)$$

$$By = -\frac{Kr}{t} Xr_0$$

When embodied as described above, the invention allows the intensity and direction of the internal magnetic field of the specimen 6 under its irradiated spot to be known together with the X rays and secondary electrons generated from the same irradiated spot.

Also according to the invention, the specimen 6 has its irradiated spot scanned when suitably moved. This makes it possible to display in image format the distribution of the intensity and direction of the internal magnetic field within the specimen 6 along with the transmitted electron image, secondary electron image and fluorescent X-ray distribution thereof.

Figure 10:
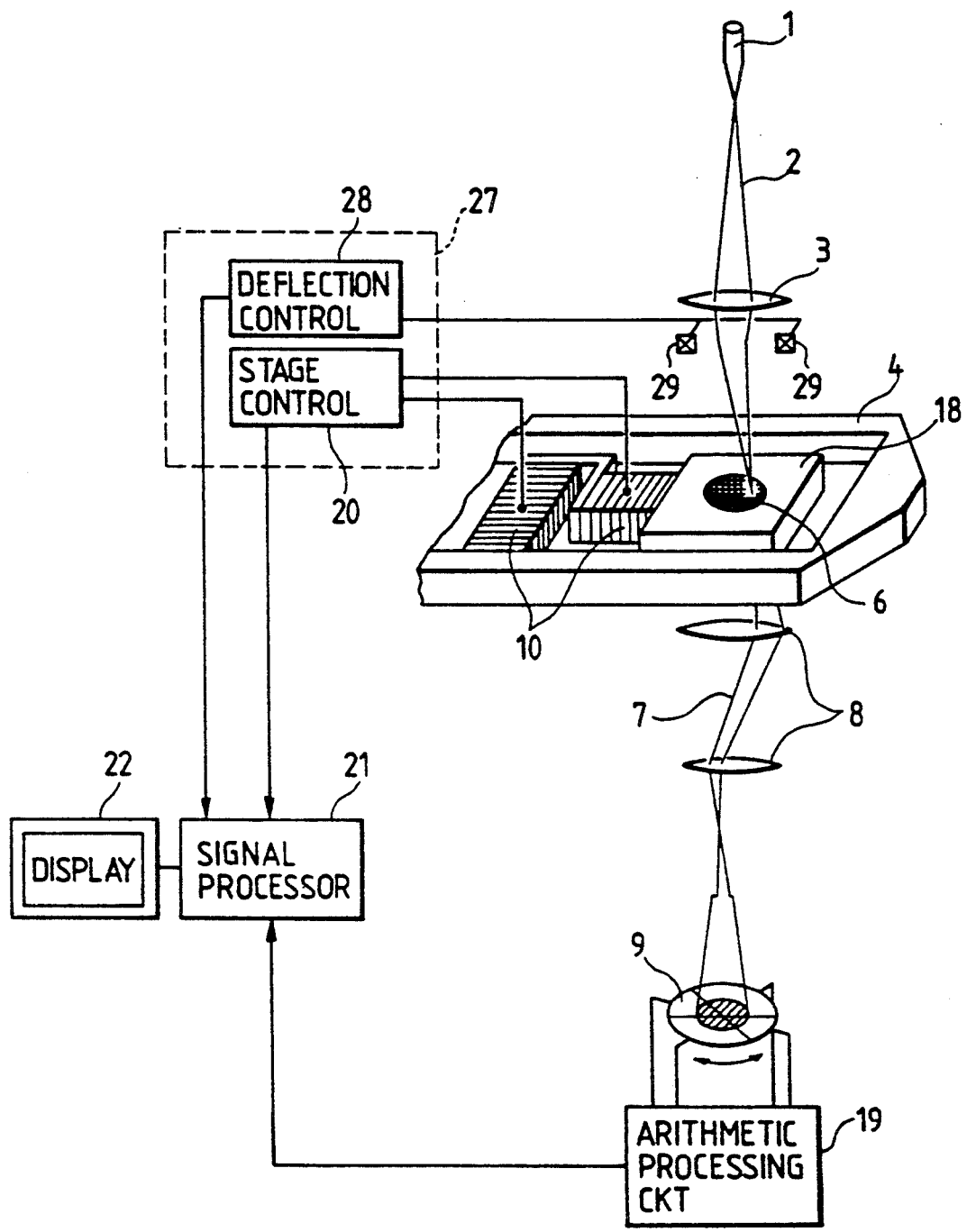
FIG. 10 is a view depicting major components of a second embodiment of the electron microscope according to the invention.

FIG. 10 is a view of the electron microscope practiced as the second embodiment of the invention. In FIGS. 10 and 1, like reference numerals designate like or corresponding parts, and any repetitive description thereof is omitted. There are two major differences between the first and the second embodiments. One difference is that the second embodiment utilizes two mechanisms in combination, one moving the specimen 6 to control the irradiated spot of the focused electron beam 2 directed thereto, the other deflecting the focused electron beam 2 on the incident side of the specimen 6. The other difference is a specific construction of the mechanism for moving the specimen 6 in the second embodiment.

The second embodiment of the invention offers three ways from which to choose for scanning: to have the electron beam 2 deflected by a deflection coil 29, to move the support (mobile stage) 18, or to combine these two ways.

The tip of the specimen stage 4, like that of the stage on conventional electron microscopes, is incorporated in the electron optics constituted by a complex combination of a plurality of electron lenses within a vacuum. This requires that the tip of the specimen stage 4 be substantially smaller in external dimensions than the conventional actuator that operates in the same manner as the mobile stage 18. The reason for the reduction in size is that it is necessary to keep the specimen stage 4 from structurally and mechanically interfering with the adjacent parts of the main body of the electron microscope. These requirements are met by the second embodiment using the structures of FIGS. 11 through 16 in the tip of the specimen stage 4. (In each of FIGS. 11 through 16, views (a) and (b) are a plan and a side view, respectively, the side view partially containing a sectional view.)

Figure 11:
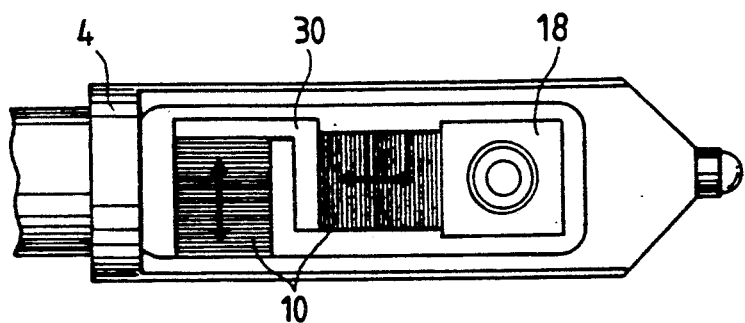
FIGS. 11(a-b) through 16(a-b) show plan and side views of each of the structures that constitute variations of a specimen stage 4 in FIG. 2.
Figure 11:
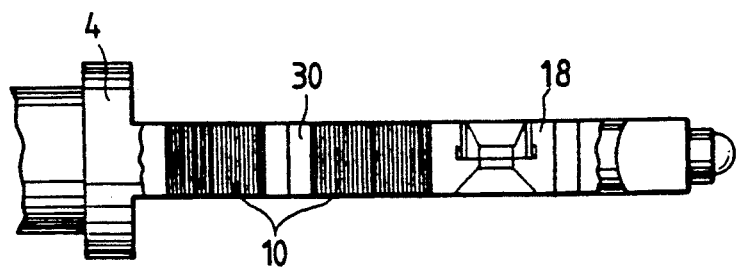

With the structure of the specimen stage 4 shown in FIG. 11, two piezoelectric devices 10 are coupled through an L-shaped relay part 30, the devices expanding and contracting normal to each other and in parallel with the applied electric field. Those surfaces of the two piezoelectric devices 10 which are opposite to those connected to the relay part 30 are fixedly secured to the specimen stage 4 and mobile stage 18. In addition, the piezoelectric devices 10 are laterally provided with a conductive shield. The shield not only keeps the specimen 6 from getting charged up; the shield also prevents the electric field applied to the devices 10 from affecting the route of the electron beam 2, and protects the devices 10 from malfunctioning under the influence of scattered or secondary electrons.

Figure 12:
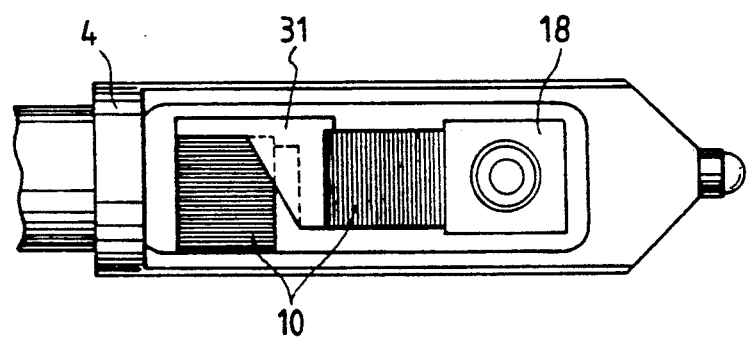
Figure 12:
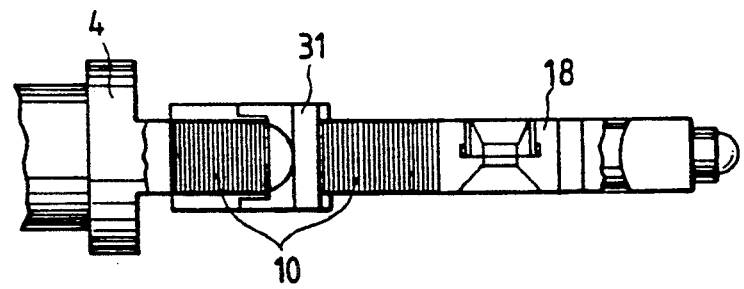

With the structure of the specimen stage 4 depicted in FIG. 12, two piezoelectric devices 10 are connected to a laterally reinforced L-shaped relay part 31, the devices expanding and contracting normal to each other. Compared with the structure of FIG. 11, the structure of FIG. 12 provides the benefit of high resistance to abnormal oscillation thanks to the high rigidity of its moving parts including the mobile stage 18 and the piezoelectric devices 10.

Figure 13:
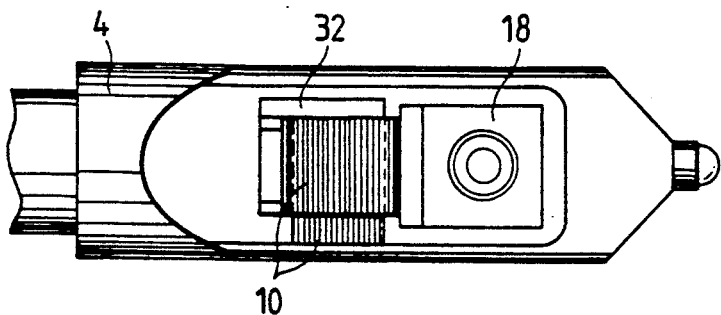
Figure 13:
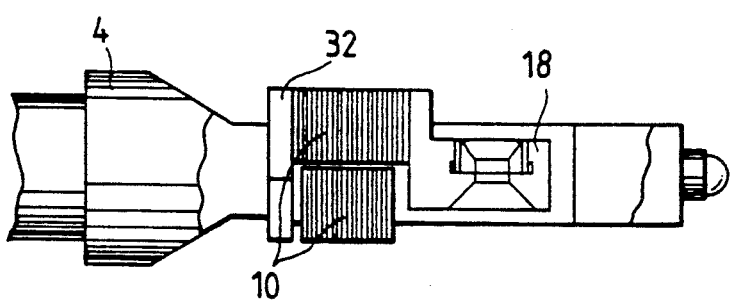

With the structure of the specimen stage 4 in FIG. 13, two piezoelectric devices 10 are coupled one over the other through a relay part 32, the devices 10 expanding and contracting normal to each other. Needless to say, the two piezoelectric devices 10 are not in contact with each other. The structure of FIG. 13 offers the benefit of high resistance to torsional vibration because the moment of inertia of its moving parts including the mobile stage 18 and piezoelectric devices 10 is smaller than that of the structure of FIG. 11 or 12.

Figure 14:
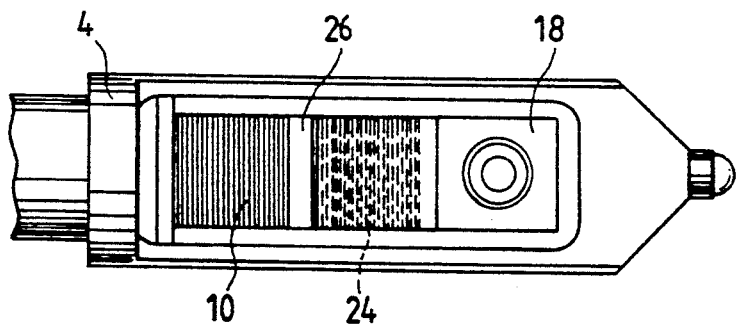
Figure 14:
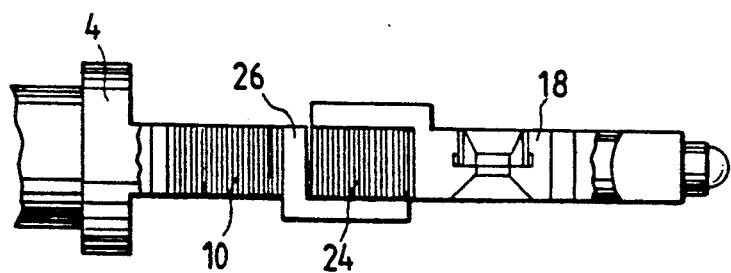

Whereas the structures illustrated in FIGS. 11, 12 and 13 each use the piezoelectric devices 10 expanding and contracting in parallel with the applied electric field, the structure of FIG. 14 employs piezoelectric devices 24 that perform shearing motion perpendicular to the applied electric field. In the structure of FIG. 14, two piezoelectric devices 24 performing shearing motion normal to each other are directly coupled. Those surfaces of the devices 24 which are opposite to their coupling surfaces are fixedly attached to the specimen stage 4 and mobile stage 18. This structure provides the benefit of high rigidity because large areas of the devices 24 are allocated for coupling purposes.

Figure 15:
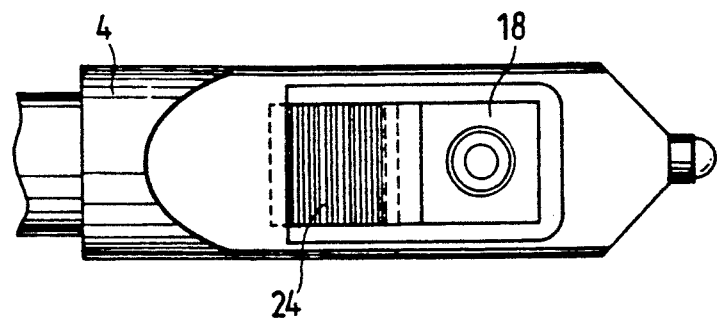
Figure 15:
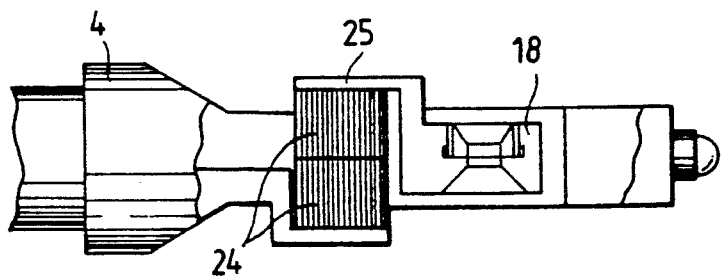
Figure 16:
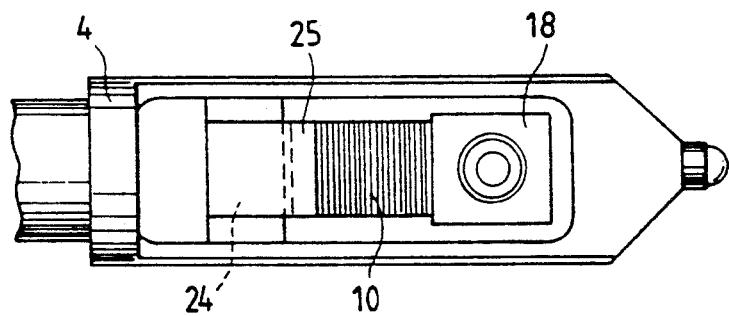
Figure 16:
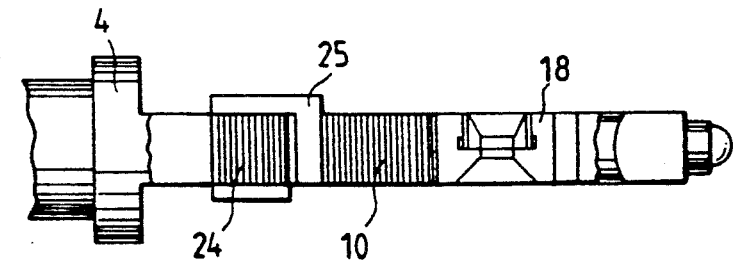

With each of the structures of the specimen stage 4 shown in FIGS. 15 and 16, a piezoelectric device 10 expanding and contracting in parallel with the applied electric field is combined through a relay part 25 with another piezoelectric device 24 that performs shearing motion perpendicular to that electric field.

In the structure of FIG. 15, the piezoelectric devices 10 and 24 are fixedly attached to the mobile stage 18 and specimen stage 4, respectively. As described, the two piezoelectric devices are coupled through the relay part 25, the device 10 expanding and contracting in parallel with the applied electric field, the device 24 performing shearing motion perpendicular to that electric field. In the structure of FIG. 16, the piezoelectric devices 24 and 10 are fixedly attached to the specimen stage 4 and mobile stage 18, respectively. Also as described, the two piezoelectric devices are coupled through the relay part 25, the device 10 expanding and contracting in parallel with the applied electric field, the device 24 performing shearing motion perpendicular to that electric field.

The structures of FIGS. 15 and 16 are highly rigid because large areas of the piezoelectric devices incorporated may be allocated for coupling purposes like the structure of FIG. 14. Furthermore, it is known that the amount of expansion or contraction of piezoelectric devices in parallel with the applied electric field is greater than the amount of shearing motion of the devices perpendicular to that field. Thus the structure of FIG. 15 or 16 provides a larger observable area of the piezoelectric devices than the structure of FIG. 14 for expansion and contraction in parallel with the applied electric field.

The structures of FIGS. 11 through 16 are small enough in external dimensions to avoid structural or mechanical interference with the adjacent parts in the main body of the electron microscope. In addition, the use of the piezoelectric devices 10 and 24 that may be expanded and contracted on the order of several angstroms permits highly accurate movement of the specimen 6.

Referring to FIGS. 17(A) through 17(E), what follows is a description of preferred methods for observing microscopic images on the electron microscope according to the invention.

Under the method of FIG. 17(A), the mobile stage 18 is held stationary while the electron beam 2 is made to scan by the deflection coil 29 to obtain a scanning image (large area standard measurement). This method works on the same principles for obtaining images as those of the conventional STEM (scanning transmission electron microscope). Unlike the STEM, however, the method of FIG. 17(A) additionally allows a magnetic field distribution image to be acquired unless very high levels of accuracy or sensitivity are required thereof. Because the scanning with the electron beam 2 provides a larger scanning range than the scanning with the mobile stage 18, the method of FIG. 17(A) is suitable for acquiring an outline of the magnetic field distribution over a relatively large area.

Under the method of FIG. 17(B), the electron beam 2 is not deflected and the mobile stage 18 is made to scan by the piezoelectric device 10 to obtain a scanning image (small area standard measurement). Because the electron beam 2 is completely fixed under this method, the problem of dislocation does not theoretically arise. With the accuracy and sensitivity very high in detecting the deflection of the electron beam 2 by the internal magnetic field of the specimen 6, the method of FIG. 17(B) allows a precise magnetic distribution image to be acquired. However, the scanning with the mobile stage 18 provides a smaller scanning range than the scanning with the electron beam 2. Thus the method of FIG. 17(B) offers a smaller range of measurement than the method of FIG. 17(A).

The method of FIG. 17(C) works with the setup shown in FIG. 8. Specifically, the stage controller 20 in a position controller 27 is used under the method of FIG. 17(B) (small area standard measurement) to obtain image data. A plurality of image data are obtained by repeatedly having a deflection controller 28 in the position controller 27 control the deflection coil 29 to change the deflection of the electron beam 2 slightly. The resulting multiple image data are composed into a single image for display by the signal processor 21 and display 22 having image processing functions (large area high resolution measurement I). The above-described method allows the measurement of magnetic field distribution with high accuracy, implemented by the method of FIG. 17(B), to be applied to larger areas.

Under the method of FIG. 17(D), the electron beam 2 performs the same scanning for image acquisition as under the method of FIG. 17(A), while the mobile stage 18 carries out small oscillatory scanning, the amplitude of the latter scanning being sufficiently smaller than the target area of measurement. Using a built-in lock-in detection function, the signal processor 21 and the display 22 extract the oscillation count ($\omega$) component of the small oscillatory scanning from a signal that enters a position detector 9 (large area high resolution measurement II). Since the lock-in function is generally an effective means for gaining high sensitivity, the method of FIG. 17(D) provides measurement of magnetic field distribution at higher levels of sensitivity than the method of FIG. 17(A).

Under the method of FIG. 17(E), the mobile stage 18 performs the same scanning for image acquisition as under the method of FIG. 17(B), while the electron beam 2 carries out small oscillatory scanning whose amplitude is sufficiently smaller than the target area of measurement. Using the built-in lock-in detection function, the signal processor 21 and the display 22 extract the oscillation count ($\omega$) component of the small oscillatory scanning from the signal that enters the position detector 9 (small area high resolution measurement). Because the method of FIG. 17(E) provides the same high sensitivity levels as the method of FIG. 17(D) through lock-in detection, the former permits measurement of magnetic field distribution at higher levels of sensitivity than the method of FIG. 17(B).

As described, the preferred methods and apparatus embodying the invention make it possible not only to acquire ordinary STEM images but also to measure the intensity and distribution of the internal magnetic field of the specimen 6 with high spatial resolution and sensitivity over a large target area of measurement. When supplemented by an X-ray detector or secondary electron detector arrangement, the embodiments of the invention allow images of the composition distribution and surface morphology of the specimen to be obtained.

As described and according to the invention, a transmitted electron image, an internal magnetic field distribution (intensity and direction) image, a composition distribution image and a surface morphology image are acquired by two means: moving the specimen in a scanning manner, and having the electron beam conventionally scan its object.

One significant feature of the invention is its ability to obtain scanning images on a transmission electron microscope without the need for electron beam scanning. This feature is particularly effective in determining the internal magnetic distribution of specimens with precision and sensitivity.

The above feature entails the advantage of allowing the point of observation to be shifted on a monocrystal specimen without altering diffraction conditions at all. As a result, the embodiments of the invention eliminate the customary drop in contrast in the periphery of a diffraction image obtained by the prior art scanning transmission electron beam microscope that utilizes electron beam scanning; a constant level of contrast is maintained over the entire image. This in turn eliminates the need for sensitivity correction over the whole image acquired.

If the effective area of a specimen to be detected by a detector is small, the scanning with the electron beam may cause the transmitted beam past the specimen to develop a slight misalignment when the beam reaches the detector. The misalignment changes the signal intensity. This phenomenon can develop into the problem of image dislocation on a conventional scanning transmission electron microscope that acquires microscopic images through electron beam scanning. By contrast, the present invention circumvents this problem by causing the specimen itself to scan instead of the electron beam.

The fact that electron beam scanning is not a mandatory requirement for obtaining scanning images provides additional advantages including a simplified structure and control scheme of the electron optics.

The method of scanning the specimen with piezoelectric devices is not known only for its advantages; it is conventionally associated with the problem of an inconveniently small area of measurement. However, the invention resolves this problem using the electron beam scanning method in combination with the method based on piezoelectric devices. When embodied as described, the invention permits measurement of large areas with high accuracy.

Of the two scanning methods that the present invention employs in combination, one method additionally provides small oscillatory scanning for signal modulation. This feature permits highly sensitive measurement through lock-in detection.

What is claimed is:

1. An electron microscope comprising an irradiating mechanism for irradiating a focused electron beam to a ferromagnetic specimen, and a detecting mechanism having a detecting section for detecting the deflection of a transmitted electron beam after it has passed said specimen, said irradiating mechanism further comprising a specimen-moving mechanism for moving said specimen so as to scan a spot irradiated by said focused electron beam on said specimen, said detecting mechanism further comprising a display means for receiving from said specimen-moving mechanism a signal for representing said irradiated spot and a signal for denoting the position of said transmitted electron beam, said display means converting said signals which are input thereto into an internal microscopic magnetic field image of said specimen.

2. An electron microscope according to claim 1, wherein said irradiating mechanism further comprises an electron beam focusing mechanism and a specimen movement controller, said electron beam focusing mechanism making the diameter of said focused electron beam smaller than the dislocation of the spot irradiated by said focused electron beam on said specimen, said specimen movement controller supplying said specimen moving mechanism with a voltage such that the spot irradiated by said focused electron bean on a particular plane of said specimen is moved in a scanning manner, said detecting mechanism further comprising a data processor and a display unit, said data processor receiving and processing data about said irradiated spot on said specimen and the signal for denoting the position of said transmitted electron beam, said received data and said received signal coming from said specimen movement controller, said display unit displaying the result of said processing as an internal information distribution image of said specimen.

3. An electron microscope according to claim 2, wherein said specimen moving mechanism has a plurality of piezoelectric devices, a mobile stage and a stage control means, said mobile stage having its specimen-mounting location equipped with a hole through which an electron beam passes, said mobile stage allowing said plurality of piezoelectric devices to move said specimen normal to said electron beam, said stage control means applying a driving voltage to said plurality of piezoelectric devices for position control.

4. An electron microscope according to claim 3, wherein said specimen moving mechanism further comprises a support with a hole through which an electron beam passes, said specimen being fixedly attached to the position of said hole of said support, said support being mounted on said mobile stage.

5. An electron microscope according to claim 4, wherein said specimen moving mechanism further comprises a shield against scattered and secondary electrons as well as electric fields, said shield being mounted on at least either said support or said mobile stage.

6. An electron microscope according to claim 3, wherein said specimen moving mechanism further comprises a shield against electric fields, said shield being mounted on at least either said plurality of piezoelectric devices or said mobile stage.

7. An electron microscope according to claim 3, wherein said plurality of piezoelectric devices are composed of a first and a second piezoelectric device expanding and contracting in parallel with the electric field produced by application of said driving voltage, said first piezoelectric device having one side thereof connected to said mobile stage, said connected side of said first piezoelectric device being normal to the expanding and contracting direction thereof, said first piezoelectric device having the other side thereof connected directly to or indirectly through a relay part to one side of said second piezoelectric device whose expanding and contracting direction is normal to that of said first piezoelectric device, said latter connected side of first piezoelectric device being normal to the expanding and contracting direction thereof, said second piezoelectric device having the other side thereof being connected to a specimen stage, said connected side of said second piezoelectric device being normal to the expanding and contracting direction thereof.

8. An electron microscope according to claim 3, wherein said plurality of piezoelectric devices are composed of a first and a second piezoelectric device performing shearing motion normal to the electric field produced by application of said driving voltage, said first piezoelectric device having one side thereof connected to said mobile stage, said connected side of said first piezoelectric device being normal to said electric field, said first piezoelectric device having the other side thereof connected to one side of said second piezoelectric device performing shearing motion normal to that of said first piezoelectric device, said connected side of said second piezoelectric device being normal to said electric field, said second piezoelectric device having the other side thereof connected to said mobile stage, said latter connected side of said second piezoelectric device being normal to said electric field.

9. An electron microscope according to claim 3, wherein said plurality of piezoelectric devices are composed of a first and a second piezoelectric device expanding and contracting in parallel with the electric field produced by application of said driving voltage, said first piezoelectric field having one side thereof connected to said mobile stage, said connected side of said first piezoelectric device being normal to said electric field, said first piezoelectric field having the other side thereof connected directly to or indirectly through a relay part to one side of said second piezoelectric device whose expanding and contracting direction is normal to the direction of the shearing motion performed by said first piezoelectric device, said latter connected side of said first piezoelectric device being normal to said electric field, said directly or indirectly connected side of said second piezoelectric device being normal to said electric field, said second piezoelectric device having the other side thereof connected to a specimen stage, said latter connected side of said second piezoelectric device being normal to said electric field.

10. An electron microscope according to claim 3, wherein said plurality of piezoelectric devices are composed of a first and a second piezoelectric device, said first piezoelectric device expanding and contracting in parallel with an electric field produced by voltage application, said second piezoelectric device performing shearing motion normal to said electric field, said first piezoelectric device having one side thereof connected to said mobile stage, said connected side of said first piezoelectric device being normal to said electric field, said first piezoelectric device having the other side thereof connected directly to or indirectly through a relay part to one side of said second piezoelectric device whose shearing motion direction is normal to the expanding and contracting direction of said first piezoelectric device, said latter connected side of said first piezoelectric device being normal to said electric field, said directly or indirectly connected side of said second piezoelectric device being normal to said electric field, said second piezoelectric device having the other side thereof connected to said mobile stage, said latter connected side of said second piezoelectric device being normal to said electric field.

11. An electron microscope according to claim 2, further comprising, a means for detecting secondary electrons or X-rays generated from said specimen when said electron beam is irradiated thereto.

12. An electron microscope according to claim 2, wherein said irradiating mechanism further comprises a means for adding a small oscillation to said electron beam scan, whose amplitude is smaller than a size of a measuring area on said specimen, and wherein said detecting mechanism further comprises a means for detecting the frequency component of said small oscillation from the signal detected by said detecting means, and means for amplifying said frequency component.

13. An electron microscope according to claim 1, wherein said detecting section further comprises four split plane electrodes, a detector and a calculating means, said four split plane electrodes being split on boundaries which are normal to one another, said detector detecting a signal representing the amount of said transmitted electron beam entering said four split plane electrodes, said calculating means receiving from said detector the signal detected thereby and representing the amount of the transmitted electron beam incidence into said four split plane electrodes in order to obtain a signal for denoting the electron beam deflection caused by the magnetic field of said specimen.

14. An electron microscope according to claim 13, wherein said four split electrodes are rotatably constructed around the point of intersection formed by said boundaries normal to one another.

15. An electron microscope according to claim 14, wherein said specimen moving mechanism has a plurality of piezoelectric devices, a mobile stage and a stage control means, said mobile stage having its specimen-mounting location equipped with a hole through which an electron beam passes, said mobile stage allowing said plurality of piezoelectric devices to move said specimen normal to said electron beam, said stage control means applying a driving voltage to said plurality of piezoelectric devices for position control.

16. An electron microscope according to claim 1, further comprising a means for detecting secondary electrons or X-rays generated from said specimen when said electron beam is irradiated thereto.

17. An electron microscope comprising an irradiating mechanism for irradiating a focused electron beam to a ferromagnetic specimen and a detecting mechanism having a detecting section for detecting the deflection of a transmitted electron beam after it has passed said specimen, said irradiating mechanism comprising a specimen-moving mechanism for moving said specimen so as to scan the spot irradiated by said focused electron beam on a measuring area of said specimen, said irradiating mechanism further comprising an electron beam deflector for deflecting said focused electron beam so as to change the spot irradiated by said focused electron beam on said specimen, said detecting mechanism further comprising a display means for receiving from said specimen-moving mechanism a signal for representing said irradiated spot and a signal for denoting the position of said transmitted electron beam, said display means converting said signals which are input thereto into an internal microscope magnetic field image of said specimen.

18. An electron microscope according to claim 17, wherein said irradiating mechanism further comprises an electron beam focusing mechanism and a specimen movement controller, said electron beam focusing mechanism making the diameter of said focused electron beam smaller than the dislocation of the spot irradiated by said focused electron beam on said specimen, said specimen movement controller supplying said specimen moving mechanism with a voltage such that the spot irradiated by said focused electron beam on a particular plane of said specimen is moved in a scanning manner, said detecting mechanism further comprising a data processor and a display unit, said data processor receiving and processing data about said irradiated spot on said specimen and the signal for denoting the position of said transmitted electron beam, said received data and said received signal coming from said specimen movement controller, said display unit displaying the result of said processing as an internal information distribution image of said specimen.

19. An electron microscope according to claim 17, wherein said detecting section further comprises four split plane electrodes, a detector and a calculating means, said four split plane electrodes being split on boundaries which are normal to one another, said detector detecting a signal representing the amount of said transmitted electron beam entering said four split plane electrodes, said calculating means receiving from said detector the signal detected thereby and representing the amount of the transmitted electron beam incidence into said four split plane electrodes in order to obtain a signal for denoting the electron beam deflection caused by the magnetic field of said specimen.

20. An electron microscope according to claim 19, wherein said four split electrodes are rotatably constructed around the point of intersection formed by said boundaries normal to one another.

21. An electron microscope according to claim 20, wherein said specimen moving mechanism has a plurality of piezoelectric devices, a mobile stage and a stage control means, said mobile stage having its specimen-mounting location equipped with a hole through which an electron beam passes, said mobile stage allowing said plurality of piezoelectric devices to move said specimen normal to said electron beam, said stage control means applying a driving voltage to said plurality of piezoelectric devices for position control.

22. An electron microscope according to claim 17, wherein said specimen moving mechanism has a plurality of piezoelectric devices, a mobile stage and a stage control means, said mobile stage having its specimen-mounting location equipped with a hole through which an electron beam passes, said mobile stage allowing said plurality of piezoelectric devices to move said specimen normal to said electron beam, said stage control means applying a driving voltage to said plurality of piezoelectric devices for position control.

23. An electron microscope according to claim 22, wherein said specimen moving mechanism further comprises a support with a hole through which an electron beam passes, said specimen being fixedly attached to the position of said hole of said support, said support being mounted on said mobile stage.

24. An electron microscope according to claim 23, wherein said specimen moving mechanism further comprises a shield against scattered and secondary electrons as well as electric fields, said shield being mounted on at least either said support or said mobile stage.

25. An electron microscope according to claim 22, wherein said specimen moving mechanism further comprises a shield against electric fields, said shield being mounted on at least either said plurality of piezoelectric devices or said mobile stage.

26. An electron microscope according to claim 22, wherein said plurality of piezoelectric devices are composed of a first and a second piezoelectric device expanding and contracting in parallel with the electric field produced by application of said driving voltage, said first piezoelectric device having one side thereof connected to said mobile stage, said connected side of said first piezoelectric device being normal to the expanding and contracting direction thereof, said first piezoelectric device having the other side thereof connected directly to or indirectly through a relay part to one side of said second piezoelectric device whose expanding and contracting direction is normal to that of said first piezoelectric device, said latter connected side of first piezoelectric device being normal to the expanding and contracting direction thereof, said second piezoelectric device having the other side thereof being connected to a specimen stage, said connected side of said second piezoelectric device being normal to the expanding and contracting direction thereof.

27. An electron microscope according to claim 22, wherein said plurality of piezoelectric devices are composed of a first and a second piezoelectric device performing shearing motion normal to the electric field produced by application of said driving voltage, said first piezoelectric device having one side thereof connected to said mobile stage, said connected side of said first piezoelectric device being normal to said electric field, said first piezoelectric device having the other side thereof connected to one side of said second piezoelectric device performing shearing motion normal to that of said first piezoelectric device, said connected side of said second piezoelectric device being normal to said electric field, said second piezoelectric device having the other side thereof connected to said mobile stage, said latter connected side of said second piezoelectric device being normal to said electric field.

28. An electron microscope according to claim 22, wherein said plurality of piezoelectric devices are composed of a first and a second piezoelectric device expanding and contracting in parallel with the electric field produced by application of said driving voltage, said first piezoelectric field having one side thereof connected to said mobile stage, said connected side of said first piezoelectric device being normal to said electric field, said first piezoelectric field having the other side thereof connected directly to or indirectly through a relay part to one side of said second piezoelectric device whose expanding and contracting direction is normal to the direction of the shearing motion performed by said first piezoelectric device, said latter connected side of said first piezoelectric device being normal to said electric field, said directly or indirectly connected side of said second piezoelectric device being normal to said electric field, said second piezoelectric device having the other side thereof connected to a specimen stage, said latter connected side of said second piezoelectric device being normal to said electric field.

29. An electron microscope according to claim 22, wherein said plurality of piezoelectric devices are composed of a first and a second piezoelectric device, said first piezoelectric device expanding and contracting in parallel with an electric field produced by voltage application, said second piezoelectric device performing shearing motion normal to said electric field, said first piezoelectric device having one side thereof connected to said mobile stage, said connected side of said first piezoelectric device being normal to said electric field, said first piezoelectric device having the other side thereof connected directly to or indirectly through a relay part to one side of said second piezoelectric device whose shearing motion direction is normal to the expanding and contracting direction of said first piezoelectric device, said latter connected side of said first piezoelectric device being normal to said electric field, said directly or indirectly connected side of said second piezoelectric device being normal to said electric field, said second piezoelectric device having the other side thereof connected to said mobile stage, said latter connected side of said second piezoelectric device being normal to said electric field.

30. An electron microscope according to claim 17, further comprising a means for detecting secondary electrons or X-rays generated from said specimen when said electron beam is irradiated thereto.

31. An electron microscope according to claim 17, wherein said electron beam deflector comprises a means for adding a small oscillation to said electron beam scan, whose amplitude is smaller than the size of a measuring area on said specimen, and wherein said detecting mechanism further comprises a means for detecting the frequency component of said small oscillation from the signal detected by said detecting means, and means for amplifying said frequency component.

32. An electron microscope according to claim 17, further comprising a storage device, an image processor and a display means; said storage device storing said signals or the data about internal distribution images of said specimen based on the calculation of said signals; said image processor processing the data stored in said storage device so as to display the result of said processing as images; said display means alternating the acquisition and storage of image data through specimen scanning on the one hand, and the moving of said electron beam on the other, in such a manner that a plurality of image data obtained through said specimen scanning within the range of electron beam movement are composed into a single image for display.

33. An electron microscope specimen actuator comprising: a support with a hole through which an electron beam passes; a specimen stage with a hole through which said electron beam passes; a plurality of piezoelectric devices; a mobile stage structured to let said electron beam pass therethrough and mounted on said support, the combination of said mobile stage and said support being attached to said specimen stage via said plurality of piezoelectric devices which allow said support to move normal to said electron beam; and a stage control means for applying a driving voltage to said plurality of piezoelectric devices for position control.

34. An electron microscope specimen actuator comprising:

first and second piezoelectric devices, which are coupled through a securing means so that the first and second piezoelectric devices expand and contract normal to each other and in parallel with the applied electric field;

a mobile stage having its specimen-mounting location equipped with a hole through which an electron beam passes, said mobile stage being fixed to said first piezoelectric device to allow said first and second piezoelectric devices to move said specimen normal to said electron beam;

a specimen stage having a planar frame, one part of said second piezoelectric device being fixed to one side of the planar frame; and a stage control means for applying a driving voltage to said first and second piezoelectric devices for position control.

35. A microscope image observing method whereby an electron beam is irradiated to a magnetic specimen and the transmitted electron beam past said specimen is detected, said method comprising the step of moving said specimen in a scanning manner such that the spot irradiated by said electron beam scans a measuring area of said specimen while said electron beam is held stationary.

36. A microscope image observing method according to claim 35, whereby the spot diameter of said electron beam on said specimen is made smaller than the measuring area of said specimen, said irradiated spot of said electron beam being moved in a scanning manner within a specific plane of said specimen so that data about the irradiated spot is obtained, said data being combined with a signal representing the position of said electron beam, said combination of said data and said signal being converted to image format for display.

37. A microscopic image observing method according to claim 36, further comprising the step of alternating the acquisition and storage of image data through specimen scanning on the one hand, and the moving of said electron beam on the other, in such a manner that a plurality of image data obtained through said specimen scanning within the range of electron beam movement are composed into a single image for display.

38. A microscopic image observing method according to claim 35, further comprising the step of detecting a signal representing the incident position of said transmitted electron beam on the detecting plane of a detector, said signal being processed to obtain the status of an internal magnetic field of said specimen under the spot through which said electron beam has transmitted, said processed signal denoting an internal magnetic field distribution image of said specimen.

39. A microscope image observing method whereby an electron beam is irradiated to a magnetic specimen and the transmitted electron beam past said specimen is detected, said method comprising the step of moving said specimen in a scanning manner while said electron beam is deflected by oscillation in such a manner that the displacement of a beam spot on said specimen which depends on the oscillation is smaller than the measuring area of said specimen.

40. A microscope image observing method according to claim 39, whereby the spot of said electron beam on said specimen is made smaller than the measuring area of said specimen, said irradiated spot of said electron beam being moved in a scanning manner within a specific plane of said specimen so that the data about the irradiated spot is obtained, said data or the result of calculating said data being combined with a signal representing the position of said electron beam, said combination of said data and said signal being converted to image format for display.

41. A microscope image observing method according to claim 39, further comprising the step of detecting a signal representing the incident position of said transmitted electron beam on the detecting plane of a detector, said signal being processed to obtain the status of an internal magnetic field of said specimen under the spot through which said electron beam has transmitted, said processed signal denoting an internal magnetic field distribution image of said specimen.

42. A microscopic image observing method according to claim 39, further comprising the step of detecting the frequency component of said oscillation.

* * * * *